(12) United States Patent
Chauvet

(10) Patent No.: US 12,057,815 B2
(45) Date of Patent: Aug. 6, 2024

(54) INTERCHANGEABLE CARTRIDGE AUDIO PREAMPLIFIER FOR MICROPHONE, AND KIT COMPRISING THE SAME

(71) Applicant: ELDORA PRODUCTIONS, Courcais (FR)

(72) Inventor: Guillaume Chauvet, Chazemais (FR)

(73) Assignee: Eldora Productions, Courcais (FR)

( * ) Notice: Subject to any disclaimer, the term of this patent is extended or adjusted under 35 U.S.C. 154(b) by 226 days.

(21) Appl. No.: 17/872,729

(22) Filed: Jul. 25, 2022

(65) Prior Publication Data
US 2023/0022296 A1     Jan. 26, 2023

(30) Foreign Application Priority Data

Jul. 26, 2021    (FR) ..................................... 2108063

(51) Int. Cl.
     *H03F 3/183*      (2006.01)
     *H03G 3/30*      (2006.01)
     *H04R 3/04*      (2006.01)

(52) U.S. Cl.
CPC ........... *H03F 3/183* (2013.01); *H03G 3/3005* (2013.01); *H04R 3/04* (2013.01); *H03F 2200/03* (2013.01); *H03G 2201/103* (2013.01); *H04R 2420/09* (2013.01); *H04R 2430/01* (2013.01)

(58) Field of Classification Search
None
See application file for complete search history.

(56) References Cited

U.S. PATENT DOCUMENTS

| | | |
|---|---|---|
| 3,562,445 A | 2/1971 | McCanney |
| 3,806,820 A | 4/1974 | Uchiyama |
| 4,105,945 A | 8/1978 | Sano et al. |
| 4,210,873 A | 7/1980 | Suzuki et al. |
| 4,312,060 A | 1/1982 | Grodinsky |
| 4,512,008 A | 4/1985 | Yokoyama |
| 6,376,761 B1 * | 4/2002 | LaMarra .................. G10H 1/02 84/670 |
| 2010/0177913 A1 | 7/2010 | Chiu et al. |
| 2017/0124997 A1 | 5/2017 | Blaschke et al. |

(Continued)

FOREIGN PATENT DOCUMENTS

| | | |
|---|---|---|
| EP | 2 793 393 A1 | 10/2014 |
| GB | 2536973 A | 10/2016 |

(Continued)

*Primary Examiner* — James K Mooney
(74) *Attorney, Agent, or Firm* — Lippes Mathias LLP

(57) ABSTRACT

An audio preamplifier (1) for a microphone, including: a chassis (2) with at least one audio input (17) and at least one audio output, a control panel (3) including a gain selector (10) being arranged on one of the sides of the chassis (2), the chassis (2) further including a receiving compartment inside which a first connector is arranged; and a cartridge (6) comprising a preamplification circuit and a gain control circuit, the cartridge (6) further having a second connector complementary to the first connector, the cartridge (6) being configured for being inserted in a removable manner into the receiving compartment of the chassis (2) so as to connect the first and second connectors. An audio preamplification kit includes an audio preamplifier (1) and a plurality of additional cartridges.

14 Claims, 3 Drawing Sheets

(56) References Cited

U.S. PATENT DOCUMENTS

2019/0051273 A1\* 2/2019 Fryette .................. G10H 3/186
2020/0169097 A1   5/2020 Zhang et al.

FOREIGN PATENT DOCUMENTS

| WO | WO 2005/039041 A1 | 4/2005 |
| WO | WO 2015/166205 A1 | 11/2015 |
| WO | WO 2018/166205 A1 | 9/2018 |

\* cited by examiner

INTERCHANGEABLE CARTRIDGE AUDIO PREAMPLIFIER FOR MICROPHONE, AND KIT COMPRISING THE SAME

CROSS-REFERENCE TO RELATED APPLICATION

This application claims foreign priority to French Application No. 2108063 filed Jul. 26, 2021, and the entire disclosure of said application is hereby expressly incorporated by reference into the present specification.

FIELD OF INVENTION

The present invention relates to the field of audio preamplifiers, and concerns in particular an audio preamplifier with an interchangeable cartridge for a microphone and a preamplification kit comprising the same.

BACKGROUND

Audio preamplifiers are electronic amplifiers for previously amplifying and matching an audio signal before sending it to a main amplifier.

Audio preamplifiers for microphone are essential during audio recordings using microphones. In fact, the function thereof is to preamplify the low amplitude signals (which are very sensitive to noise) emitted by the microphones.

Conventional audio preamplifiers generally comprise a mechanical chassis wherein an electronic module comprising a preamplification circuit is securely installed. Each conventional audio preamplifier thus produces sound which depends on the electronic design thereof.

Sound engineers wishing to try a plurality of types of sounds hence must use a plurality of audio preamplifiers with a plurality of mechanical chassis, which requires buying a plurality of devices and disconnecting and reconnecting the connectors each time when changing the audio preamplifier.

Therefore, conventional audio preamplifiers, which exist since the 1920s, each have a preamplification circuit which is specific to a certain technology. At present, there is no generic system on the market with only one gain selector which can drive a plurality of preamplifier technologies (e.g. with vacuum tube, with operational amplifier, with class A transistor, etc.). Audio preamplifiers are defined by a gain and, from an electronic point of view, the gain changes according to a resistive ratio of a potentiometer. For the gain increase to be linear for the human ear, such resistive ratio is defined by a function (linear, logarithmic, anti-logarithmic, etc.) depending on the design of the preamplifier. Furthermore, the maximum resistive value is also different depending on the preamplifier technologies. Thus, it would not have been natural, nor obvious for a person skilled in the art, namely an electronics technician, to control with only one gain selector several different preamplifiers having different technologies, given that each preamplification circuit has its own resistive ratio.

US patent application US2017/124997A1 discloses an electronic musical instrument system for influencing the sound of an electric musical instrument, said system having a housing containing control electronics that have associated slots for receiving effects modules, the effects modules having potentiometers thereon so as to allow the setting thereof. Thus, when the effects module is a preamplifier module, the gain selector (i.e. the potentiometers) is arranged directly on the preamplifier module, such that each preamplifier module should have its own gain selector mounted thereon. Furthermore, control elements arranged on the system housing only have an input/output routing function, i.e. the control elements only allow to activate one or more effects modules, but the control elements do not allow to perform a gain selection in a preamplifier module. Therefore, system of document US2017/124997A1 is not a generic system which allows to control several preamplifier technologies with only one gain selector.

SUMMARY OF INVENTION

The present invention aims to solve the drawbacks of the prior art, by proposing an audio preamplifier for a microphone, having a removable cartridge incorporating the preamplification circuit, such that the preamplification function is moved into the cartridge, which can be used for easily changing the preamplification circuit, without having to change the chassis of the audio preamplifier, and without having to disconnect and then reconnect the connectors connected to the chassis.

The subject-matter of the present invention is thus an audio preamplifier for a microphone, characterized in that the audio preamplifier comprises: a chassis in which a first electronic module is arranged, the chassis comprising at least one audio input and at least one audio output which are connected to the first electronic module, a control panel comprising a gain selector being arranged on one of the sides of the chassis and connected to the first electronic module, the chassis further comprising a receiving compartment inside which is arranged a first connector connected to the first electronic module, the control panel having an opening from which the receiving compartment emerges; and a cartridge in which is arranged a second electronic module comprising a preamplification circuit and a gain control circuit, the cartridge further having a second connector which is complementary to the first connector, said second connector being connected to the second electronic module, the cartridge being configured for being inserted in a removable manner into the receiving compartment of the chassis via the opening so as to connect the first and second connectors to each other; wherein, when the cartridge is inserted into the receiving compartment of the chassis and the first and second connectors are connected together, the first electronic module is configured for transmitting an input audio signal, from the at least one audio input, to the preamplification circuit of the cartridge and a gain selection signal, from the gain selector, to the gain control circuit of the cartridge, the gain control circuit is configured for adjusting the gain of the preamplification circuit based on the gain selection signal, and the preamplification circuit is configured for preamplifying the input audio signal and transmitting the preamplified audio signal to the first electronic module which is configured for then transmitting it to the at least one audio output.

Preferentially, the control panel is arranged on the front side of the chassis and has an opening from which the receiving compartment emerges, the control panel being connected to the first electronic module by means of one or more ribbon cables.

The receiving compartment of the chassis can thus be used to receive and quickly plug in different types of preamplification circuits in the form of cartridges.

The audio preamplifier chassis is generic and regroups the electronic environment common to all audio preamplifiers (e.g., input/output, power supply, volume unit meter, volume buttons, etc.). On the other hand, the electronic part of the preamplification function is moved into the cartridge which is distinct from the chassis and is interchangeable.

The audio preamplifier according to the present invention thus makes it possible to use a plurality of types and technologies of microphone preamplifier circuits with only one generic gain selector arranged on the control panel of the chassis, the gain selector being used for adjusting, through the cartridge gain control circuit, the gain of the preamplifier circuit of the cartridge installed in the receiving compartment of the chassis.

The present invention thus has the following advantages:
- an economic interest for the user: possibility of having a plurality of different preamplification circuits without having to purchase the environment common to all preamplifiers (e.g., chassis, power supply, gain selector, volume unit meter, etc.); and
- time saving for the user: possibility to test a plurality of types of sounds by quickly changing the cartridge and without having to disconnect/reconnect the input/output cables from one peripheral to another.

The first and second complementary connectors can, e.g., be connectors of the card edge connector type.

The audio preamplifier for a microphone according to the present invention is e.g. intended for sound engineers, soundmen or audiovisual technicians.

According to a particular feature of the invention, the gain control circuit comprises a network of resistors connected to the preamplification circuit and a network of analog switches or relays connected to the network of resistors and configured for being controlled by the gain selection signal so as to change the ohmic value of the network of resistors depending on the gain selection signal.

Advantageously, the preamplification circuit of the cartridge comprises at least one power transistor configured for amplifying the received audio signal and a gain circuit (comprising resistors) connected to the at least one power transistor and used to define the gain of the at least one power transistor.

The gain selection signal from the gain selector drives the opening or closing of each of the analog switches or relays so as to define a specific ohmic value of the network of resistances based on the position of the gain selector. The network of resistances of the gain control circuit is connected to the gain circuit of the preamplification circuit and can be used, depending on the ohmic value of the network of resistances defined by the position of the gain selector, for modifying the gain of the power transistor.

In the prior art, each preamplifier design has a unique gain curve defined by the ohmic value of a potentiometer which can have a different value in ohms (e.g. 1 k, 10 k, 100 k, etc.) and a different curve (e.g. linear, logarithmic, anti-logarithmic, etc.). As indicated above, the audio preamplifiers are defined by a gain and, from an electronic point of view, the gain changes according to a resistive ratio. For the gain increase to be linear to the human ear, this resistive ratio can be defined by a function (linear, logarithmic or anti-logarithmic, etc.) depending on the preamplifier design. In addition to the shape of the curve, the maximum resistive value has also to be determined, which is also different depending on the preamplifier technology (e.g., with vacuum tube, with operational amplifier (op-amp), with class A transistor, etc.).

In the present invention, the resistive curve is replaced and reconstructed using the network of resistors and the network of analog switches or relays controlled by the gain selector.

In practice, for each existing audio preamplifier, the curve of the potentiometer is reconstructed by taking different ohmic values corresponding to all possible positions of the gain selector. The arrangement of the network of resistors and of the network of analog switches or relays in the gain control circuit of the cartridge is then chosen so as to reproduce the taken ohmic values according to the position of the gain selector. In the present invention, the low frequency (LF) signal thus remains on the cartridge.

The present invention thus makes it possible to have a generic chassis or rack, the control panel of which can control any electronic design of preamplification circuits, and to keep the low amplitude LF signal on the cartridge.

According to a particular feature of the invention, the gain selector is a twelve-position switch, the twelve positions corresponding to twelve different ohmic values of the network of resistors of the gain control circuit.

The gain selector is therefore like a potentiometer.

The twelve positions of the gain selector may, e.g., correspond to the following gains for the preamplification circuit: 0, 6, 12, 18, 24, 30, 36, 42, 48, 54, 60, and 66 dB.

According to a particular feature of the invention, the second electronic module of the cartridge further comprises, downstream of the preamplification circuit, a de-symmetrization circuit and a symmetrization circuit.

Thus, the de-symmetrization circuit is used for de-symmetrizing the preamplified audio signal at the output of the preamplification circuit, and then the symmetrization circuit is used for re-symmetrizing the preamplified audio signal before sending it to the at least one audio output.

Advantageously, the output of the de-symmetrization circuit is connected to the first electronic module of the chassis via the first and second connectors for processing by the first electronic module, the signal thus processed then being resent to the symmetrization circuit, the output of which being connected to the at least one audio output via the first and second connectors and then the first electronic module.

According to a particular feature of the invention, the cartridge is metallic so as to serve as a Faraday cage.

Thus, the presence of the LF signal in the Faraday cage type cartridge makes it possible to obtain an optimal electromagnetic compatibility (EMC) result.

According to a particular feature of the invention, the at least one audio input and the at least one audio output are of at least one type amongst jack-plug type and XLR type.

A jack plug connector comprises a + pole and a ground and is used for sending a so-called unbalanced signal, while an XLR connector comprises a + pole, a − pole and a ground and is used for sending a so-called balanced signal.

Preferentially, the chassis includes a jack-plug type audio input and an XLR-type audio input (with automatic jack plug/XLR switching by the first electronic module), and an XLR-type audio output.

Advantageously, when an audio signal is transmitted to an jack-plug type audio input, the audio signal is first symmetrized by the first electronic module before being transmitted to the preamplification circuit.

According to a particular feature of the invention, the control panel further comprises a volume unit meter connected to the first electronic module.

Thus, the volume unit (VU) meter is used for visually indicating, e.g. by means of different light-emitting diodes (LEDs), the sound level of the output audio signal.

According to a particular feature of the invention, the chassis further comprises a power supply input connected to the first electronic module and to the first connector via an on/off switch arranged on the control panel.

Advantageously, the power supply input is 115/230 VAC, 50/60 Hz, and is connected to a AC/AC and AC/DC 48 VDC, +/−12 VDC, 36 VAC power supply arranged in the chassis, for supplying power to the different electronic circuits of the audio preamplifier.

The on/off switch allows the user to turn the power supply to the audio preamplifier on or off.

According to a particular feature of the invention, the first electronic module comprises an output power control circuit configured for setting the output power of the preamplified audio signal as a function of an output power selection signal from an output power selector arranged on the control panel.

The output power selector is thus used to select the sound level of the audio signal at the output of the audio preamplifier.

Advantageously, when the first and second connectors are connected, the input of the output power control circuit of the chassis corresponds to the output of the de-symmetrization circuit of the cartridge, and the output of the output power control circuit of the chassis corresponds to the input of the symmetrization circuit of the cartridge.

Advantageously, the output power control circuit further has an impedance matching circuit.

Advantageously, a switch is connected to the VU meter for selecting whether the VU meter visually represents the sound level before or after the preamplified audio signal has passed through the output power control circuit.

According to a particular feature of the invention, the output power control circuit further comprises a high-pass filter configured for being activated by a high-pass filter activation switch arranged on the control panel.

Thus, the high-pass filter activation switch provides the user with the choice whether or not to activate the high-pass filter. The high-pass filter activation switch can have e.g. three possible positions: 80 Hz cut-off frequency; Stop; and 120 Hz cut-off frequency.

The high-pass filter may, e.g., be an active high-pass (or low cut) filter with a slope of −12 dB/octave.

According to a particular feature of the invention, the first electronic module comprises a 48V phantom power supply circuit downstream of an XLR type audio input, said 48V phantom power supply circuit being configured for being activated by a 48V phantom power supply activation switch arranged on the control panel.

The 48V phantom power circuit allows a microphone, which needs electrical current to operate, to be connected to the balanced XLR type audio input.

Preferentially, an indicator light is provided on the control panel for indicating the status of the 48V phantom power supply activation switch.

According to a particular feature of the invention, the first electronic module comprises a phase inversion circuit arranged between the at least one audio input and the first connector, said phase inversion circuit being configured for being activated by a phase inversion activation switch arranged on the control panel.

Thus, the phase inversion circuit is used to reverse the phase of the input audio signal when the phase inversion activation switch is actuated.

Preferentially, an indicator light is provided on the control panel for indicating the status of the phase inversion activation switch.

Advantageously, a jack-plug type audio input and an XLR type audio input are connected to the phase inversion circuit, and the phase inversion circuit includes an electromagnetic compatibility (EMC) filter.

According to a particular feature of the invention, the first electronic module comprises a −20 dB attenuation block circuit arranged between the at least one audio input and the first connector, said −20 dB attenuation block circuit being configured for being activated by a −20 dB attenuation block activation switch arranged on the control panel. In this way, the −20 dB attenuation block circuit, also called the 0/−20 dB Passive Attenuation Device (PAD), is used for attenuating the input audio signal by −20 dB (before sending said input audio signal to the preamplification circuit) when the −20 dB attenuation block activation switch is actuated.

Preferentially, an indicator light is provided on the control panel for indicating the status of the −20 dB attenuation block activation switch.

The present invention further relates to an audio preamplification kit comprising an audio preamplifier as described above and a plurality of additional cartridges, each additional cartridge comprising a preamplification circuit and a gain control circuit which are connected to a second connector which is complementary to the first connector of the chassis of the audio preamplifier, each additional cartridge being configured for being inserted alone and in a removable manner into the receiving compartment of the chassis so as to connect the first and second connectors to each other, wherein any two cartridges amongst the cartridge of the audio preamplifier and the additional cartridges have at least one amongst different preamplifier circuits and different gain control circuits. Thus, the receiving compartment of the chassis of the audio preamplification kit according to the present invention can be used for the insertion of one cartridge alone chosen according to the desired preamplification.

The preamplification function of the kit can thus be easily and quickly changed by removing the cartridge currently plugged in and replacing it with another cartridge of the kit having a suitable preamplification function.

BRIEF DESCRIPTION OF DRAWINGS

To better illustrate the subject-matter of the present invention, a preferred embodiment will be described below, as an illustration and not limited to, with reference to the annexed drawings.

On these drawings.

DETAILED DESCRIPTION OF INVENTION

Figure 1:
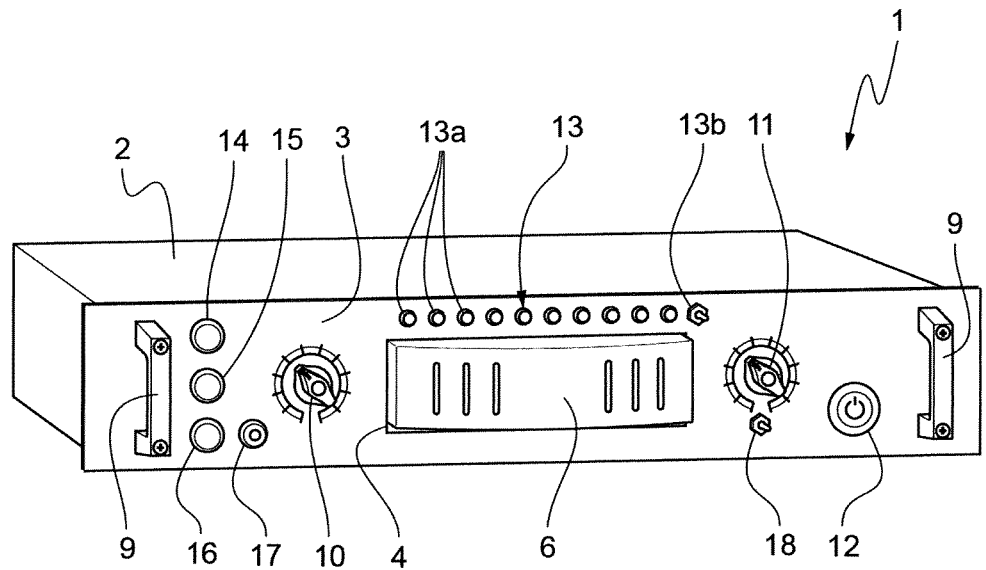
FIG. 1 is a perspective view of an audio preamplifier for a microphone according to the present invention.
Figure 2:
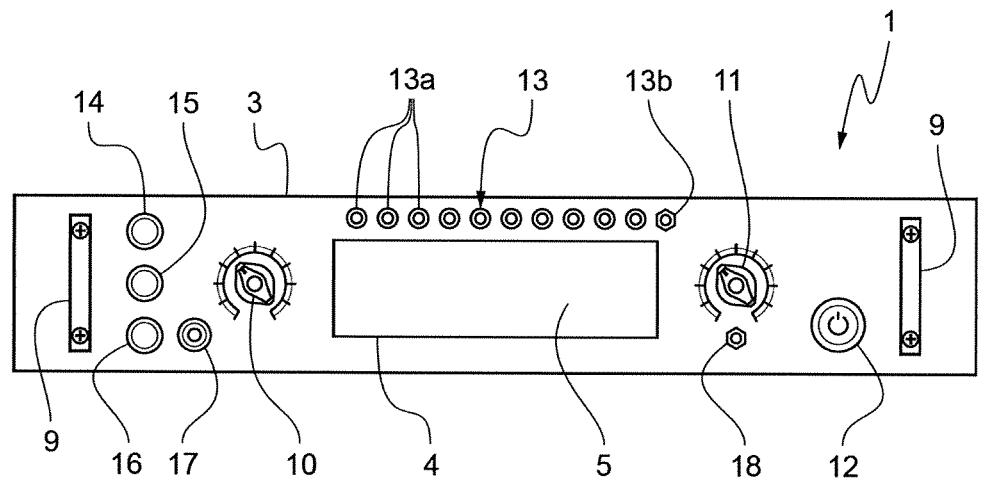
FIG. 2 is a front view of the audio preamplifier, without the cartridge thereof.
Figure 3:
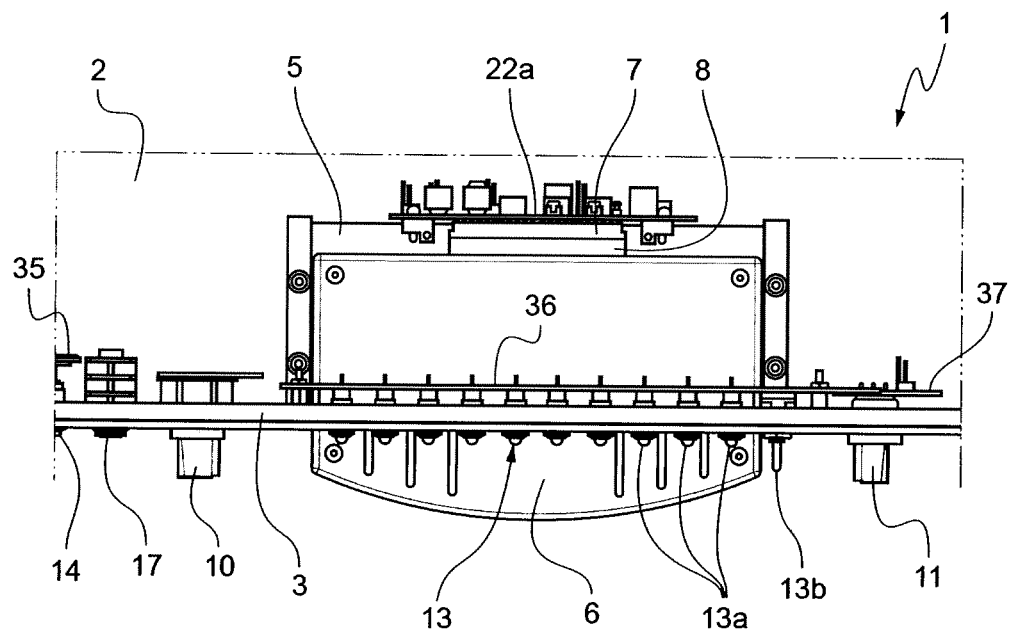
FIG. 3 is a partial sectional view of the audio preamplifier, at the cartridge thereof.

With reference to FIGS. 1 to 3, it can be seen that an audio preamplifier for microphone 1 according to the present invention is shown therein.

The audio preamplifier 1 comprises a parallelepiped-shaped chassis 2 wherein is arranged a first electronic module (not visible in FIGS. 1 to 3, and which will be described in greater detail in FIG. 4).

A control panel 3 is arranged on the front side of the chassis 2 and has a rectangular opening 4 from which emerges a receiving compartment 5 formed inside the chassis 2.

The audio preamplifier 1 further comprises a cartridge 6, of substantially parallelepipedal shape, configured to be inserted in a removable manner into the receiving compartment 5 of the chassis 2 via the rectangular opening 4 of the control panel 3.

FIG. 1 shows the audio preamplifier 1 when the cartridge 6 is inserted into the receiving compartment 5 of the chassis, while FIG. 2 shows the audio preamplifier 1 when the cartridge 6 is not inserted into the receiving compartment 5 of the chassis 2.

As shown in FIG. 3, a first connector 7 is arranged at the bottom of the receiving compartment 5 of the chassis 2, and a second connector 8, matching the first connector 7, is arranged on the rear side of the cartridge 6, such that, when the cartridge 6 is inserted up to the bottom of the receiving compartment 5 of the chassis 2, the first and second connectors 7 and 8 are connected to each other.

The first 7 and second 8 complementary connectors can e.g. be connectors of the card edge connector type.

The chassis 2 is generic and brings together the electronic environment common to all audio preamplifiers. On the other hand, the electronic part of the preamplification function is moved into the cartridge 6 which is interchangeable.

The receiving compartment 5 of the chassis 2 thus makes it possible to accommodate and quickly connect different types of preamplification circuits in the form of a cartridge 6.

Two handles 9 are fixed by screwing on either side of the control panel 3, so as to facilitate the installation and extraction of the audio preamplifier 1.

The control panel 3 comprises a gain selector 10, in the form of a rotary-type switch with twelve positions (like a potentiometer) corresponding respectively to twelve different gain values (e.g., 0, 6, 12, 18, 24, 30, 36, 42, 48, 54, 60 and 66 dB), allowing the user to choose the gain of the audio preamplifier 1.

The control panel 3 further comprises an output power selector 11 in the form of a rotary-type switch with twelve positions corresponding respectively to twelve different output power values, this allowing the user to choose the sound level of the audio signal at the output of the audio preamplifier 1.

The control panel 3 further comprises an on/off switch 12 which allows the user to turn the audio preamplifier 1 on and off.

The control panel 3 further comprises a volume unit (VU) meter 13 comprising ten light-emitting diodes 13a, so as to visually indicate to the user the sound level of the output audio signal from the audio preamplifier 1.

Advantageously, the ten light-emitting diodes (LEDs) comprise six green LEDs (corresponding to sound levels of −20 dB, −10 dB, −7 dB, −5 dB, −3 dB, and −1 dB, respectively), a yellow LED (corresponding to a sound level of 0 dB) and three red LEDs (corresponding to sound levels of +1 dB, +2 dB, and +3 dB, respectively).

The VU meter 13 further comprises a switch 13b which allows the user to choose whether the VU meter 13 visually represents the sound level before or after the preamplified audio signal has passed through an output power control circuit connected to the output power selector 11.

The control panel 3 further includes a 48V phantom power supply activation switch 14, a phase inversion activation switch 15, a −20 dB attenuation block activation switch 16 and a high-pass filter activation switch 18.

Advantageously, each of the switches 14, 15, 16 is push-button and includes an indicator light for indicating the status of the switch to the user.

The control panel 3 further comprises a jack-plug type audio input 17.

Figure 4:
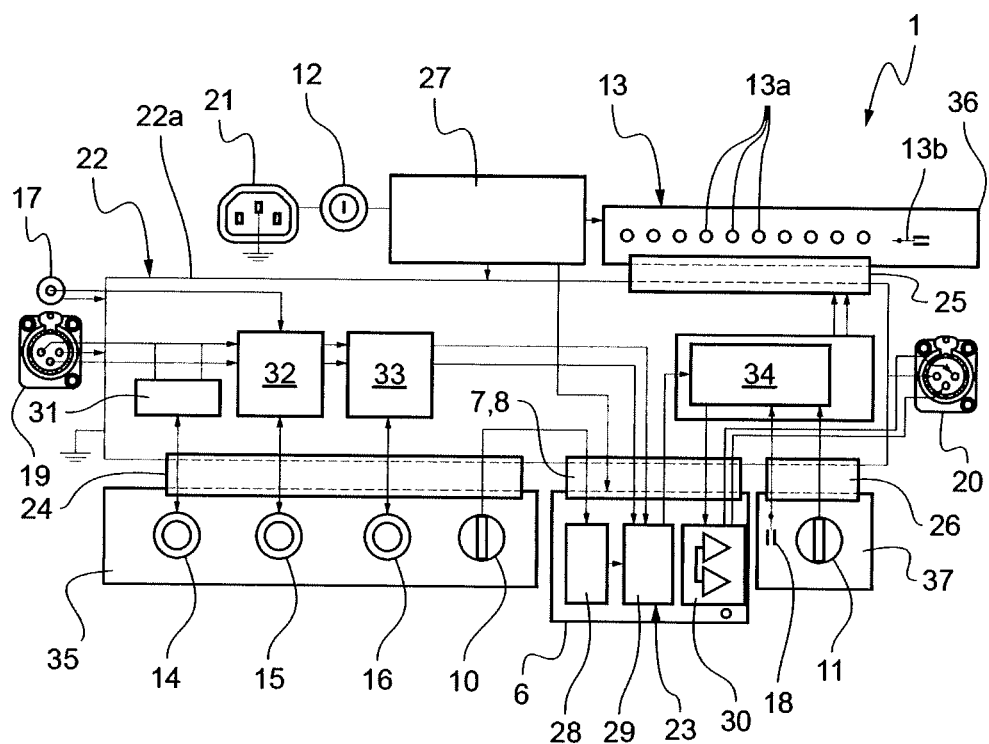
FIG. 4 is a block diagram of the audio preamplifier.

With reference to FIG. 4, it can be seen that the block diagram of the audio preamplifier 1 according to the present invention is shown therein. In addition to the jack-plug type audio input 17, the audio preamplifier 1 further comprises an XLR type audio input 19 and an XLR type audio output 20 which are both arranged on the rear side of the chassis 2.

The jack-plug type audio input 17 comprises a positive pole and a ground and allows a so-called unbalanced signal to be transmitted, while the XLR type audio input 19 and the XLR type audio output 20 each comprise a positive pole, a negative pole and a ground and allow a so-called balanced signal to be transmitted.

The audio preamplifier 1 also comprises a 115/230 VAC, 50/60 Hz power supply input 21 arranged on the rear side of the chassis 2.

A first electronic module 22 connected to the first connector 7 is arranged on a main board 22a in the chassis 2 of the audio preamplifier 1, and a second electronic module 23 connected to the second connector 8 is arranged in the cartridge 6.

When the cartridge 6 is inserted into the receiving compartment 5 of the chassis 2, the first and second connectors 7 and 8 are connected to each other, in such a way that the second electronic module 23 is connected to the first electronic module 22 via the first and second connectors 7 and 8.

The gain selector 10 and the three switches 14, 15 and 16 are mounted on a first control panel board 35.

The LEDs 13a and the switch 13b of the VU meter 13 are mounted on a second control panel board 36.

The output power selector 11 and the high-pass filter activation switch 18 are mounted on a third control panel board 37.

The first electronic module 22 is directly connected to the jack-plug audio input 17, to the XLR audio input 19 and to the XLR audio output 20. The first electronic module 22 is also connected to the gain selector 10 and to the switches 14, 15 and 16 by means of a first ribbon cable 24. The first electronic module 22 is further connected to the VU meter 13 by means of a second ribbon cable 25, and to the output power selector 11 and to the switch 18 by means of a third ribbon cable 26.

The power supply input 21 is connected, via the on/off switch 12, to an AC/AC and AC/DC 48 VDC, +/−12 VDC, 36 VAC power supply 27, arranged in the chassis 2 and connected to the first electronic module 22, to the second electronic module 23 via the first and second connectors 7 and 8, and to the VU meter 13, so as to supply power to said various components when the on/off switch 12 is in the on position.

The second electronic module 23 of the cartridge 6 comprises a gain control circuit 28, a preamplification circuit 29 and a de-symmetrization/symmetrization circuit 30.

The first electronic module 22 of the chassis 2 comprises a 48V phantom power supply circuit 31 connected to the 48V phantom power supply activation switch 14 via the first ribbon cable 24 and to the XLR audio input 19, so that, when the switch 14 is actuated by the user, the 48V phantom power supply circuit 31 is configured for providing a 48V phantom voltage to the XLR audio input 19 for powering a microphone plugged into the latter.

The first electronic module 22 further comprises a phase inversion circuit 32 connected directly to the jack-plug audio input 17 and to the XLR audio input 19, and connected to the phase inversion activation switch 15 via the first ribbon cable 24. The phase inversion circuit 32 is configured for performing an automatic jack-plug/XLR switching depending on the used audio input and for symmetrizing the input audio signal when same comes from the jack-plug audio input 17. The phase inversion circuit 32 is also configured for inverting the phase of the input audio signal when the phase inversion activation switch 15 is actuated. The phase inversion circuit 32 further includes an electromagnetic compatibility (EMC) filter.

The first electronic module 22 further comprises a −20 dB attenuation block circuit 33, the balanced input of which is connected to the balanced output of the phase inversion circuit 32. The −20 dB attenuation block circuit 33 is further connected to the −20 dB attenuation block activation switch 16 via the first ribbon cable and is configured for attenuating the input audio signal by −20 dB when the −20 dB attenuation block activation switch 16 is actuated. The balanced output of the −20 dB attenuation block circuit 33 is connected to the balanced input of the preamplification circuit 29 of the second electronic module 23 of the cartridge 6 via the first and second connectors 7 and 8.

The first electronic module 22 is also configured for transmitting a gain selection signal, from the gain selector 10, to the gain control circuit 28 of the second electronic module 23 of the cartridge 6, the gain control circuit 28 being configured for adjusting the gain of the preamplifier circuit 29 of the cartridge 6 based on said received gain selection signal.

The preamplification circuit 29 is configured for preamplifying the balanced audio signal from the −20 dB attenuation block circuit 33 into a balanced preamplified audio signal, then the preamplified balanced audio signal is de-symmetrized by the de-symmetrization circuit of the de-symmetrization/symmetrization circuit 30 into an preamplified unbalanced audio signal and then transmitted, via the first and second connectors 7 and 8, to an output power control circuit 34 of the first electronic module 22.

The output power control circuit 34 of the first electronic module 22 is configured for adjusting the output power of the preamplified unbalanced audio signal according to an output power selection signal from the output power selector 11.

The output power control circuit 34 further includes an impedance matching circuit and an active −12 dB/octave high-pass filter configured to be activated by the high-pass filter activation switch 18 having three possible positions: 80 Hz cut-off frequency; Stop; and 120 Hz cut-off frequency.

The input and the output of the output power control circuit 34 are connected to the VU meter 13 via the second ribbon cable 25, the switch 13b of the VU meter 13 allowing the user to choose whether the VU meter 13 visually represents the sound level before or after passing the preamplified audio signal through the output power control circuit 34.

The unbalanced audio signal at the output of the output power control circuit 34 is then transmitted to the de-symmetrization/symmetrization circuit 30, the symmetrization circuit of which re-symmetrizes the audio signal before transmitting same to the XLR audio output 20 via the two connectors 7 and 8 and the first electronic module 22.

The cartridge 6 is metallic so as to serve as a Faraday cage, the presence of the low frequency signal in the Faraday cage-type cartridge 6 being thus used for obtaining an optimal electromagnetic compatibility (EMC) result.

Figure 5:
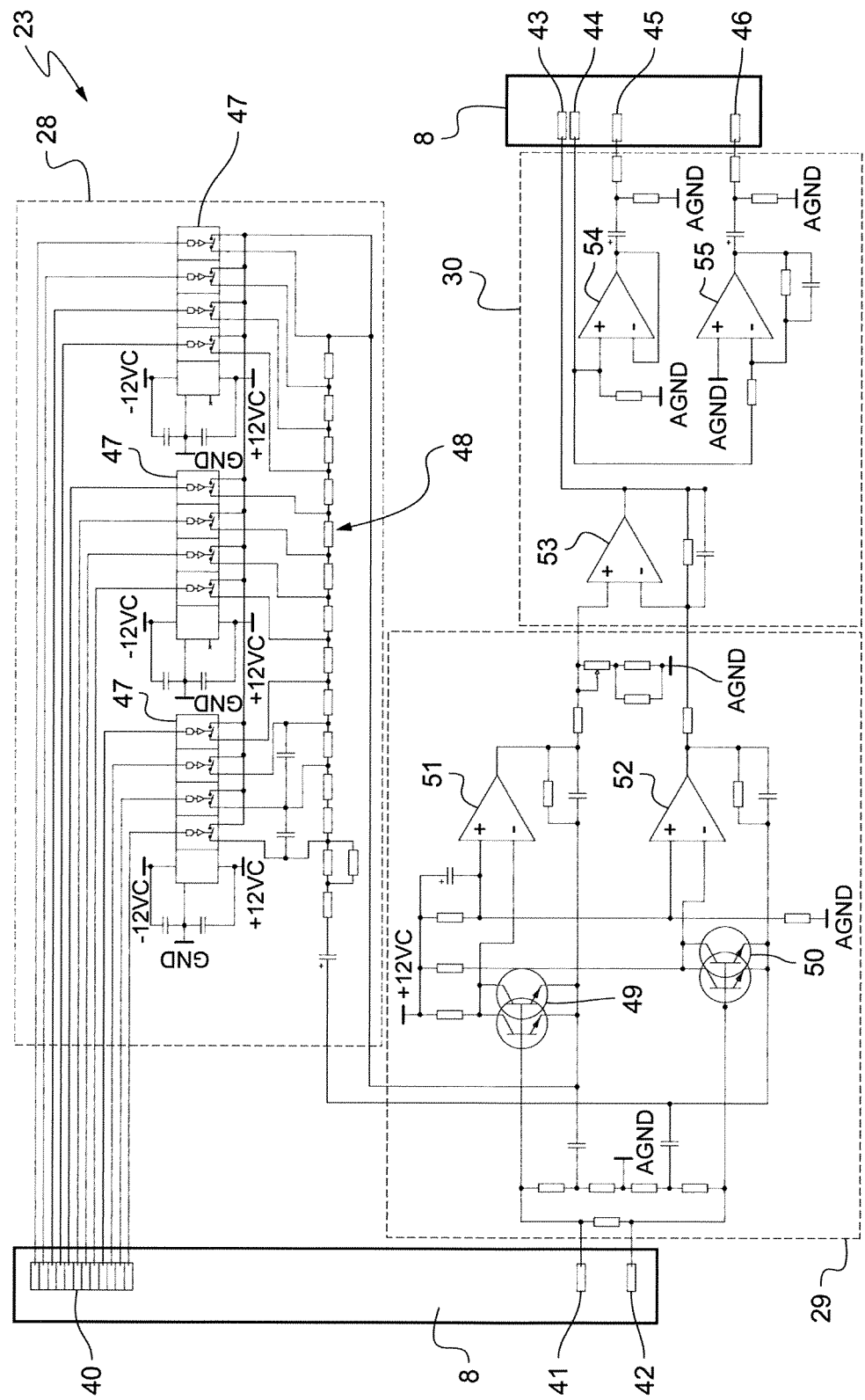
FIG. 5 is an electronic diagram as an example of the cartridge of the audio preamplifier.

With reference to FIG. 5, it can be seen that an arrangement is shown therein, as an example of the second electronic module 23 of the cartridge 6 of the audio preamplifier 1.

The second connector 8 comprises one 12-bit gain selection signal input terminal 40, two input terminals 41 and 42 for a balanced audio signal to be preamplified, an output terminal 43 for an unbalanced preamplified audio signal, one input terminal 44 for a power-controlled unbalanced preamplified audio signal and two output terminals 45 and 46 for a output power-controlled preamplified balanced audio signal.

The gain control circuit 28 comprises a network of twelve analog switches 47, the digital control inputs of which are connected to the 12-bit gain selection signal input terminal 40. When the cartridge 6 is mounted in the chassis 2, each of the twelve analog switches 47 is connected to one of the twelve bits of the gain selection signal from the gain selector 10 of the control panel 3.

The gain control circuit 28 further comprises a network of resistors 48 connected to the network of analog switches 47, the control of the network of analog switches 47 by the gain selection signal being used for changing the overall ohmic value of the network of resistors 48 as a function of the gain selection signal, i.e. as a function of the position of the gain selector 10.

Each of the twelve positions of the gain selector 10 corresponds to a different ohmic value of the network of resistors 48 of the gain control circuit 28. The network of resistors 48 is connected to the preamplification circuit 29 so as to modify the gain of the preamplification circuit 29 as a function of the ohmic value of the network of resistors 48, as defined by the position of the gain selector 10.

The preamplification circuit 29 comprises a first pair of parallel power transistors 49, the gates of which are connected to one 41 of the two input terminals 41 and 42 for the balanced audio signal to be preamplified, and a second pair of parallel power transistors 50, the gates of which are connected to the other 42 of the two input terminals 41 and 42 for the balanced audio signal to be preamplified.

The preamplification circuit 29 further comprises a first operational amplifier 51, the negative input of which is connected to drains of the first pair of transistors 49, and a second operational amplifier 52, the negative input of which is connected to drains of the second pair of transistors 50.

The preamplification circuit 29 further comprises a plurality of resistors and a plurality of capacitors which, in association with the network of resistors 48, one of the ends of which is connected to sources of the first pair of transistors 49 and the other of the ends of which is connected to sources of the second pair of transistors 50, can be used for defining the gain of the preamplification circuit 29.

The network of resistors 48 of the gain control circuit 28 thus makes it possible to reconstruct the resistive gain curve (e.g., linear, logarithmic or anti-logarithmic, etc.) of any existing preamplifier (e.g., with vacuum tube, with operational amplifier (op-amp), with class A transistor, etc.).

In practice, for each existing audio preamplifier, the potentiometer curve is reconstructed by taking different ohmic values corresponding to all the possible positions of the gain selector 10. The arrangement of the network of resistors 48 and of the network of analog switches 47 in the gain control circuit 28 of the cartridge 6 is then chosen to reproduce the ohmic values taken according to the position of the gain selector 10.

The present invention thus makes it possible to have a generic chassis 2, the control panel 3 of which can control any electronic design of preamplification circuit in the form of a cartridge 6, and to keep the low-frequency low-amplitude signal in the cartridge 6.

The de-symmetrization/symmetrization circuit 30 comprises a de-symmetrization circuit comprising a third operational amplifier 53 associated with a resistor and a capacitor connected in parallel between the negative terminal and the output of the third operational amplifier 53, the positive and negative inputs of the third operational amplifier being connected to the positive and negative outputs, respectively, for the balanced preamplified audio signal at the output of the preamplification circuit 29. The output of the third operational amplifier 53 is connected to the output terminal 43 for the preamplified unbalanced audio signal so as to be connected to the output power control circuit 34 of the chassis 2 when the cartridge 6 is mounted in the chassis 2.

The de-symmetrization/symmetrization circuit 30 further comprises a symmetrization circuit comprising a fourth operational amplifier 54 and a fifth operational amplifier 55 associated with resistors and capacitors. The positive input of the fourth operational amplifier 54 and the negative input of the fifth operational amplifier 55 are both connected to the input terminal 44 for the power-controlled unbalanced preamplified audio signal, which is connected, when the cartridge 6 is mounted in the chassis 2, to the output of the output power control circuit 34 of the chassis 2.

The outputs of the fourth and fifth operational amplifiers 54 and 55 thus form the positive and negative outputs of the preamplified balanced audio signal after adjustment of the output power, and are connected respectively to the two output terminals 45 and 46 for the output power-controlled balanced preamplified audio signal, so as to be transmitted to the XLR audio output 20 of the chassis 2 when the cartridge 6 is mounted in the chassis 2.

It should be noted that the second electronic module 23 of the cartridge 6 could further have any other arrangement, without deviating from the scope of the present invention, the only condition being that the second electronic module 23 comprises any network of resistors 48 associated with any network of analog switches or relays 47 for adjusting the gain of the preamplification circuit 29 as a function of the position of the gain selector 10.

The present invention further relates to an audio preamplification kit comprising an audio preamplifier 1 as described hereinabove and a plurality of additional cartridges (not shown in the Figures), each additional cartridge comprising a preamplification circuit 29 and a gain control circuit 28 associated with a second connector 8 matching to the first connector 7 of the chassis 2 of the audio preamplifier 1, each additional cartridge being configured for being inserted singly and in a removable manner into the receiving compartment 5 of the chassis 2 so as to connect the first and second connectors 7 and 8 to each other, where any two cartridges amongst the cartridge 6 of the audio preamplifier 1 and the additional cartridges have at least one amongst different preamplifier circuits 29 and different gain control circuits 28.

Thus, the receiving compartment 5 of the chassis 2 of the audio preamplification kit according to the present invention can be used for the insertion of a single cartridge 6 chosen according to the desired preamplification. The preamplification function of the kit can thus be easily and quickly changed by removing the cartridge 6 currently plugged in and replacing it with another cartridge in the kit having a suitable preamplification function.

It is understood that the particular embodiment which has just been described has been given as a non-limiting indication, and that modifications could be made without deviating from the present invention.

The invention claimed is:

1. An audio preamplifier for microphone, wherein the audio preamplifier comprises:
a chassis in which a first electronic module is arranged, the chassis comprising at least one audio input and at least one audio output which are connected to the first electronic module, a control panel comprising a gain selector being arranged on one side of the chassis and connected to the first electronic module, the chassis further comprising a receiving compartment inside which is arranged a first connector connected to the first electronic module, the control panel having an opening from which the receiving compartment emerges; and
a cartridge in which is arranged a second electronic module comprising a preamplification circuit and a gain control circuit, the cartridge further having a second connector which is complementary to the first connector, the second connector being connected to the second electronic module, the cartridge being configured for being inserted in a removable manner into the receiving compartment of the chassis via the opening of the control panel so as to connect the first and second connectors to each other;
wherein, when the cartridge is inserted into the receiving compartment of the chassis and the first and second connectors are connected together, the first electronic module is configured for transmitting an input audio signal, from the at least one audio input, to the preamplification circuit of the cartridge and a gain selection signal, from the gain selector, to the gain control circuit of the cartridge, the gain control circuit is configured for adjusting the gain of the preamplification circuit based on the gain selection signal, and the preamplification circuit is configured for preamplifying the input audio signal into a preamplified audio signal and transmitting the preamplified audio signal to the first electronic module which is configured for then transmitting the preamplified audio signal to the at least one audio output.

2. The audio preamplifier according to claim 1, wherein the gain control circuit comprises a network of resistors connected to the preamplification circuit, and a network of analog switches or relays connected to the network of resistors and configured for being controlled by the gain selection signal so as to change an ohmic value of the network of resistors depending on the gain selection signal.

3. The audio preamplifier according to claim 2, wherein the gain selector is a twelve-position switch, the twelve positions of the twelve-position switch corresponding to twelve different ohmic values of the network of resistors of the gain control circuit.

4. The audio preamplifier according to claim 1, wherein the second electronic module of the cartridge further comprises, downstream of the preamplification circuit, a de-symmetrization circuit and a symmetrization circuit.

5. The audio preamplifier according to claim 1, wherein the cartridge is metallic so as to serve as a Faraday cage.

6. The audio preamplifier according to claim 1, wherein the at least one audio input and the at least one audio output are of at least one type amongst jack-plug type and XLR type.

7. The audio preamplifier according to claim 1, wherein the control panel further comprises a volume unit meter connected to the first electronic module.

8. The audio preamplifier according to claim 1, wherein the chassis further comprises a power supply input connected to the first electronic module and to the first connector via an on/off switch arranged on the control panel.

9. The audio preamplifier according to claim 1, wherein the first electronic module comprises an output power control circuit configured for setting an output power of the preamplified audio signal as a function of an output power selection signal from an output power selector arranged on the control panel.

10. The audio preamplifier according to claim 9, wherein the output power control circuit further comprises a high-pass filter configured for being activated by a high-pass filter activation switch arranged on the control panel.

11. The audio preamplifier according to claim 1, wherein the first electronic module comprises a 48V phantom power supply circuit downstream of an XLR type audio input, the 48V phantom power supply circuit being configured for being activated by a 48V phantom power supply activation switch arranged on the control panel.

12. The audio preamplifier according to claim 1, wherein the first electronic module comprises a phase inversion circuit arranged between the at least one audio input and the first connector, the phase inversion circuit being configured for being activated by a phase inversion activation switch arranged on the control panel.

13. The audio preamplifier according to claim 1, wherein the first electronic module comprises a −20 dB attenuation block circuit arranged between the at least one audio input and the first connector, the −20 dB attenuation block circuit being configured for being activated by a −20 dB attenuation block activation switch arranged on the control panel.

14. An audio preamplification kit comprising the audio preamplifier according to claim 1 and a plurality of additional cartridges, each additional cartridge of the plurality of additional cartridges comprising a preamplification circuit and a gain control circuit which are connected to a second connector which is complementary to the first connector of the chassis of the audio preamplifier, each additional cartridge of the plurality of additional cartridges being configured for being inserted alone and in a removable manner into the receiving compartment of the chassis so as to connect the first and second connectors to each other, wherein any two cartridges amongst the cartridge of the audio preamplifier and the additional cartridges have at least one amongst different preamplifier circuits and different gain control circuits.

* * * * *